June 7, 1966 C. L. EMMERICH 3,255,446
COMPENSATED ANALOGUE TO DIGITAL CONVERTER
Filed April 4, 1961
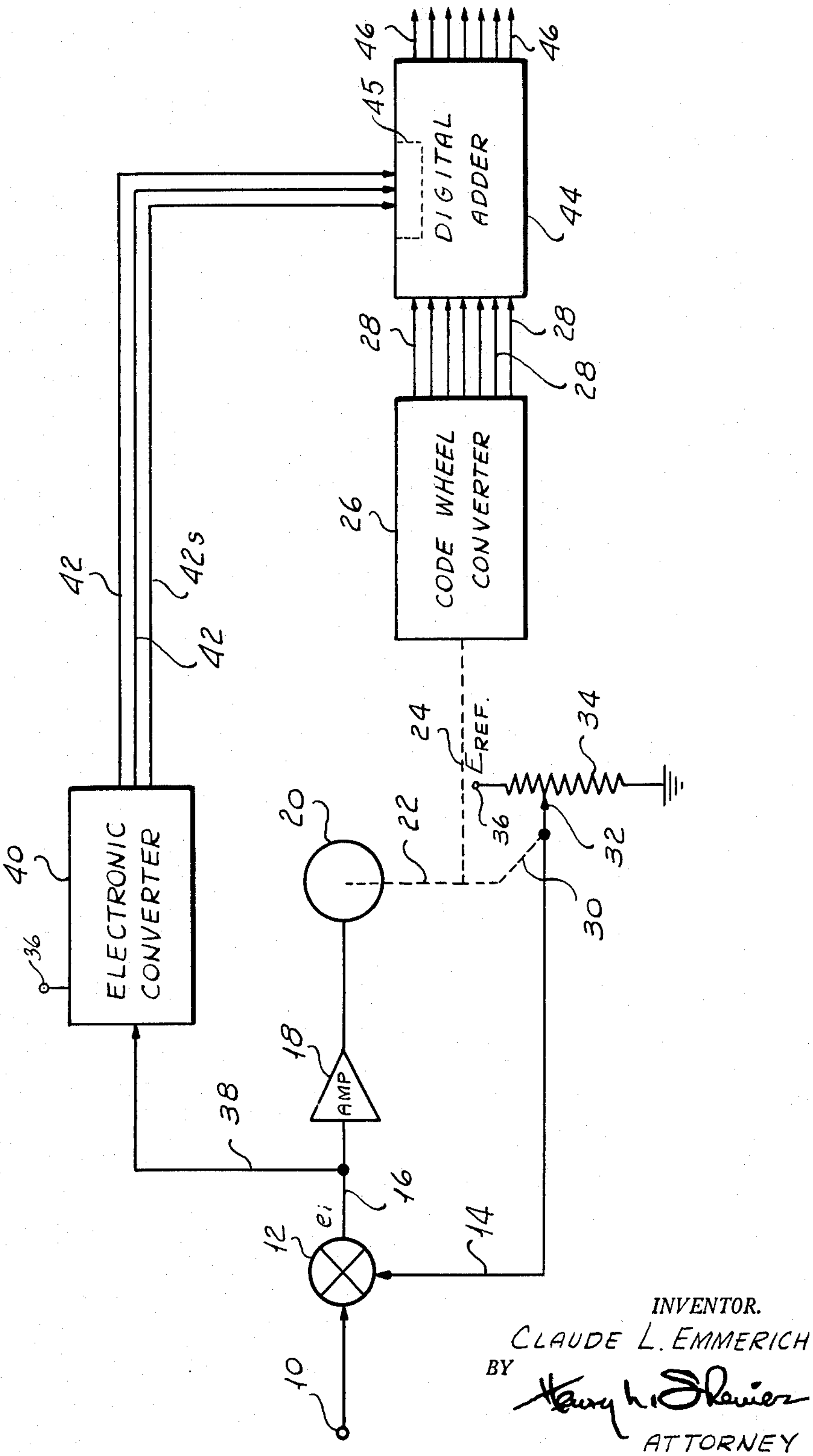
INVENTOR.
CLAUDE L. EMMERICH
BY
ATTORNEY

United States Patent Office 3,255,446
Patented June 7, 1966

3,255,446

COMPENSATED ANALOGUE TO DIGITAL CONVERTER

Claude L. Emmerich, Scarsdale, N.Y., assignor to United Aircraft Corporation, East Hartford, Conn., a corporation of Delaware Filed Apr. 4, 1961, Ser. No. 100,595
5 Claims. (Cl. 340—347)

My invention relates to an analogue to digital converter and more particularly to a compensated analogue to digital conversion system which operates accurately at high speeds over a relatively wide range.

In analogue to digital conversion systems of the type known in the prior art which are to produce a digital representation of an analogue input signal the signal is applied through a comparator and an amplifier to a servomotor which drives the input shaft of a converter of the code wheel type to cause the converter to produce a digital output signal representing the analogue input signal. The servomotor which drives the converter input shaft also drives a brush or the like along a potentiometer resistance to which a reference signal is applied. The potential of the potentiometer brush is applied to the converter which produces an output error signal which is amplified and applied to the servomotor. While this system functions satisfactorily over a wide range for relatively slowly varying input signals, owing to the lag in the servo system the digital output signal is not an accurate representation of the input signal where this latter signal varies relatively rapidly. Stated otherwise, a system of this type employing a coded wheel converter while it has a high dynamic range is a low speed device.

There are known also in the prior art electronic analogue to digital converters which are adapted to operate at relatively high speeds to those at which coded wheel converters function satisfactorily. While these electronic converters are capable of high speed operation, they operate over a relatively narrow range.

It is often desirable that an analogue to digital conversion be accomplished over a wide range for a rapidly varying analogue input signal. Owing to the defects pointed out hereinabove of converters of the prior art this operation has not heretofore been possible.

I have invented a compensated analogue to digital conversion system which is adapted to operate over a wide range at relatively high speeds. My system produces an accurate digital output representation of a rapidly varying analogue input signal fed thereto. In my system I take advantage both of the wide range possible with code wheel conversion and of the high speed operation of an electronic converter.

Another object of my invention is to provide a compensated analogue to digital conversion system which overcomes the defects of converters of the prior art.

A further object of my invention is to provide a compensated analogue to digital conversion system which produces an accurate digital output representation of a rapidly varying analogue input signal.

Still another object of my invention is to provide a compensated analogue to digital conversion system which combines the advantage of high dynamic range code wheel conversion with the advantage of high speed electronic conversion.

Other and further objects of my invention will appear from the following description.

In general my invention contemplates the provision of a compensated analogue to digital conversion system in which I apply the error signal of the input comparator of a code wheel converter to an electronic analogue to digital converter. I add the output of the electronic analogue to digital converter to the output of the code wheel converter driven by the servomotor to produce a digital output representation which is an accurate representation of a rapidly varying analogue input signal fed to the input comparator.

In the accompanying drawing to which reference is made in the following description the figure is a schematic view of my compensated analogue to digital conversion system.

Referring now to the drawing, my compensated analogue to digital conversion system includes an input terminal 10 to which I apply the analogue signal which is to be converted to digital form. Terminal 10 is connected to one input of an analogue comparator 12 of any suitable type known to the art which in response to the application of a signal to the terminal 10 and the application of a signal to a channel 14 connected to the other input terminal of the comparator produces an error signal $e_1$ on an output channel 16. The comparator 12 may be any siutable network which determines the difference between two signals applied to its input terminals as the analogue output error signal $e_1$.

An amplifier 18 connects the channel 16 to a servomotor 20 to energize the motor to drive its output shaft indicated schematically by the broken line 22 in the figure. Through any suitable linkage known to the art the shaft 22 drives the input shaft 24 of an analogue to digital converter 26 of the code wheel type. As is known in the art, in response to rotary displacement of its input shaft 24, the converter 26 produces a digital representation of shaft position on a plurality of output channels 28. The code wheel converter 26 may, for example, be of the type shown in Patent No. 2,873,440, issued February 10, 1959, to Jack B. Speller for an analogue to digital converter.

I employ any suitable linkage indicated schematically by the broken line 30 in the figure to drive a brush 32 adapted to be moved along a potentiometer resistance winding 34 connected between a terminal 36 to which I apply a suitable reference potential $E_{ref}$ and ground. Brush 32 provides the second input for comparator 12 through the channel 14.

In operation of the system thus far described with an analogue signal applied to the terminal 10 comparator 12 produces an output error signal $e_1$ which is amplified by the amplifier 18 and fed to the servomotor 20 to cause the motor to drive shaft 22. In response to rotation of shaft 22 shaft 24 is displaced and brush 32 moves along winding 34. As shaft 24 is displaced the converter 26 produces an output representation on channels 28 of the digital equivalent of the rotary displacement of shaft 24. If the potential picked off winding 34 by brush 32 equals the analogue input at terminal 10 the error signal $e_1$ is zero and the output on channels 28 is an accurate digital representation of the analogue input signal.

I have discovered that, owing to the lag in the servo system including motor 20 and the potentiometer including winding 34 and brush 32, where the analogue input signal applied to terminal 10 varies rapidly the output on channels 28 is not always an accurate representation of the input signal. A channel 38 applies the error signal $e_1$ on channel 16 to an electronic analogue to digital converter 40 which, in response to the analogue voltage, produces a digital representation of the voltage at a plurality of output channels 42. The converter 40 may be of any suitable type known to the art which will produce the result outlined above. FIGURE 5 of the copending application Serial No. 771,543, filed November 3, 1958, by Orville V. Greunke and Frank S. Preston for a Multi-Phase Analogue to Digital Converter, now Patent No. 2,976,528, shows an arrangement which performs the operation outlined above in connection with the electronic converter 40. It will be remembered as pointed out hereinabove that electronic converters such as the converter 40, while capable of high speed operation, operate over a relatively narrow range. Since as will be pointed out hereinafter the error signal $e_i$ is small the low dynamic range of the converter 40 does not deleteriously affect the operation of my system while the high speed operation enhances the operation of my system.

I apply the signal on channels 28 to a digital adder 44 as one input thereto. I apply the signals on channels 42 to the digital adder 44 as the second input thereto. The adder 44 may be of any suitable type known to the art which in response to two digital inputs produces outputs on a plurality of channels 46 affording a representation of the digital sum of the two digital inputs. A channel 42*s* carries a signal indicating that a substraction, rather than an addition operation should take place. The signal on this channel actuates a complement generator 45 indicated in broken lines as forming part of the adder 44. This signal causes complements of the output of converter 40 to be fed to adder 44 which adds these complements to the signals on channels 28 to produce a difference output on channels 46 in a manner known to the art. A circuit for accomplishing the desired operations in adder 44 can readily be mechanized by use of the techniques disclosed on pages 18–11 to 18–15 of volume 2 of the Handbook of Automation, Computation, and Control, published by John Wiley & Sons, Inc., New York, 1959. It is to be noted that I reference the converter 40 to the voltage $E_{ref}$ at terminal 36

In operation of my compensated analogue to digital conversion system with an input signal applied to the terminal 10 and a feedback signal on channel 14 comparator 12 produces an analogue error signal which is relatively small. This error signal is amplified by the amplifier 18 and energizes motor 20 to displace shaft 24 of the converter 26 to change the digital representation on the output channels 28. At the same time it drives brush 32 in a direction to reduce the error signal to zero. The electronic converter 40 converts the error signal $e_i$ to a digital representation on the channels 42. Adder 44 sums the digital output of the code wheel converter 26 and the digital output of the electronic converter 40 on channels 42 to produce an output on channels 46 which accurately represents in digital form the analogue input at terminal 10. The addition of the electronic converter signal to the code wheel converter output compensates for the lag in the servo system including motor 20 and the potentiometer having the winding 34 and the brush 32. It will readily be appreciated that the error signal $e_1$ always is small so that the range over which electronic converter 40 must operate is low. It is for this reason that I have indicated fewer output channels 42 on the converter 40 than the number of output channels 28 on the converter 46. It will further be understood that the particular number of output channels shown in the drawing for any of the devices is of no significance. In practice as many output channels are used as necessary to produce the desired number of places in the digital representation.

It will be seen that I have accomplished the objects of my invention. I have provided an analogue to digital converter which affords an accurate digital output representation of a rapidly varying analogue input signal. My conversion system is a high-speed, wide-range system. I take advantage of the high speed of operation of an electronic analogue to digital converter and of the wide range of operation of a code wheel converter without permitting the low range of operation of the electronic converter or the low speed of operation of the code wheel converter to detract from the operation of my system. I employ the electronic converter to compensate for the effect of lag introduced into the code wheel conversion system.

It will be understood that certain features and subcombinations are of utility and may be employed without reference to other features and subcombinations. This is contemplated by and is within the scope of my claims. It is further obvious that various changes may be made in details within the scope of my claims without departing from the spirit of my invention. It is, therefore, to be understood that my invention is not to be limited to the specific details shown and described.

Having thus described my invention, what I claim is:

1. A system for converting an analogue input signal to a digital output signal including in combination means including an input member for producing a digital representation of the displacement of said member, means comprising a servosystem for driving said member, said servosystem having error signal generating means, said error signal generating means being responsive to an analogue input signal to produce a signal representing the positional error of said input member, means for converting said positional error signal to a digital representation of said positional error signal and means for combining said digital representations to produce the desired digital output signal.

2. A system for converting an analogue input signal to a digital output signal including in combination means comprising a member for producing a digital representation of the movement of said member, a motor adapted to be energized to drive said member, means responsive to said motor for generating a feedback signal, a comparator adapted to produce an error signal representing the positional error of said member in response to said feedback signal and an analogue input signal, means responsive to said error signal for controlling said motor, means for converting said error signal into a digital representation of the postional error of said member and means for combining said digital representations to produce the desired digital output signal.

3. A system for converting an analogue input signal to a digital output signal including in combination a comparator adapted to produce an error signal in response to an input signal and a feedback signal applied thereto, a motor adapted to be controlled in response to said error signal, a first analogue-to-digital converter having an input shaft, said converter being adapted to produce a digital output representation of rotation of said input shaft, means responsive to said motor for driving said input shaft to cause said first converter to produce a digital output representation, means responsive to said motor for generating a feedback signal representing the instantaneous position of said shaft, means for applying an analogue input signal and said feedback signal to said comparator to cause the comparator to produce an error signal representing the positional error of said shaft, means responsive to said error signal for controlling said motor, a second analogue-to-digital converter adapted to produce a digital output representation in response to a voltage applied thereto, means for applying said positional error signal to said second converter to cause it to produce a digital output representation and means for adding said digital output representations to produce the desired digital output signal.

4. A system for converting an analogue input signal to a digital output signal including in combination a code wheel analogue-to-digital converter having an input shaft and adapted to produce a digital output representation of the angular displacement of said input shaft, means comprising a servosystem for driving said code wheel converter input shaft, said servosystem including means for generating a signal representing the positional error of said input shaft, an electronic analogue-to-digital converter responsive to said positional error signal generating means for producing a digital representation of said error signal and means for combining said digital representations to produce the desired output signal.

5. A servosystem having a high speed of response including in combination an input signal, a feedback signal, means for comparing said signals to provide an error signal, a first means responsive to said error signal for providing said feedback signal, a second means responsive to said error signal for providing a correction signal, said second error signal responsive means being distinct from and having a higher speed of response than said first error signal responsive means, and means responsive to said feedback signal and to said correction signal for providing an output signal.

References Cited by the Examiner

UNITED STATES PATENTS

| | | | |
|---|---|---|---|
| 2,877,398 | 3/1959 | Gimpel | 340—347 X |
| 2,971,141 | 2/1961 | Gevas | 340—347 X |
| 3,045,230 | 7/1962 | Tripp et al. | 340—347 |

OTHER REFERENCES

IBM Technical Disclosure Bulletin, vol. 1, No. 2 August 1958, page 16.

MALCOLM A. MORRISON, *Primary Examiner.*

R. C. BAILEY, L.W. MASSEY, K. R. STEVENS, *Assistant Examiners.*